United States Patent
Choi et al.

(10) Patent No.: US 10,535,589 B2
(45) Date of Patent: Jan. 14, 2020

(54) CLIP STRUCTURE AND SEMICONDUCTOR PACKAGE USING THE SAME

(71) Applicant: JMJ KOREA CO., LTD., Bucheon-si, Gyeonggi-do (KR)

(72) Inventors: Yun Hwa Choi, Bucheon-si (KR); Armand Vincent Corazo Jereza, Bucheon-si (KR)

(73) Assignee: JMJ KOREA CO., LTD., Bucheon-si (KR)

( * ) Notice: Subject to any disclaimer, the term of this patent is extended or adjusted under 35 U.S.C. 154(b) by 0 days.

(21) Appl. No.: 16/035,500

(22) Filed: Jul. 13, 2018

(65) Prior Publication Data

US 2019/0019746 A1    Jan. 17, 2019

(30) Foreign Application Priority Data

Jul. 14, 2017 (KR) .................. 10-2017-0089617

(51) Int. Cl.
*H01L 23/495* (2006.01)
*H01L 23/00* (2006.01)

(52) U.S. Cl.
CPC .. *H01L 23/49534* (2013.01); *H01L 23/49517* (2013.01); *H01L 24/72* (2013.01); *H01L 2224/37124* (2013.01); *H01L 2224/37147* (2013.01)

(58) Field of Classification Search
CPC ......... H01L 23/49534; H01L 23/49517; H01L 24/72; H01L 2224/37147; H01L 2224/37124

USPC ....................................................... 257/666
See application file for complete search history.

(56) References Cited

U.S. PATENT DOCUMENTS

| | | | |
|---|---|---|---|
| 7,755,179 B2* | 7/2010 | Carney | H01L 23/4334 257/686 |
| 7,944,044 B2* | 5/2011 | Carney | H01L 23/3107 257/706 |
| 7,972,906 B2* | 7/2011 | Cruz | H01L 23/49524 438/125 |
| 9,589,929 B2* | 3/2017 | Terrill | H01L 23/3107 |

FOREIGN PATENT DOCUMENTS

| | | |
|---|---|---|
| KR | 10-1208332 | 12/2012 |
| KR | 10-1631232 | 6/2016 |
| KR | 10-1669902 | 10/2016 |
| KR | 20-0482370 | 2/2017 |

* cited by examiner

*Primary Examiner* — Luan C Thai
(74) *Attorney, Agent, or Firm* — Maschoff Brennan

(57) ABSTRACT

A clip structure and a semiconductor package using the same include different metals in multiple layers so as to selectively, easily and exactly fix semiconductor chips, which consists of a lightweight material so as to lighten the weight of semiconductor packages and to help reduce manufacturing costs, and which in particular, maintains the width of a self-welding layer consisting of a clip structure so as to help improve the quality of adhesion. That is, according to a clip structure of the present invention, which electrically connects package elements in a semiconductor package, the clip structure includes a main metallic layer that is configured to maintain a shape, and a first functional layer that is piled on one surface of the main metallic layer and consists of a metal different from that of the main metal layer.

14 Claims, 2 Drawing Sheets

CLIP STRUCTURE AND SEMICONDUCTOR PACKAGE USING THE SAME

CROSS-REFERENCE TO RELATED APPLICATIONS

A claim for priority under 35 U.S.C. § 119 is made to Korean Patent Application No. No. 10-2017-0089617 filed Jul. 14, 2017, in the Korean Intellectual Property Office, the entire contents of which are hereby incorporated reference.

BACKGROUND OF THE INVENTION

Field of the Invention

The present invention relates to a clip structure and a semiconductor package using the same and more specifically, to a clip structure and a semiconductor package using the same which consists of different metals in multiple layers so as to selectively, easily and exactly fix semiconductor chips, or which consists of a lightweight material so as to lighten the weight of semiconductor packages and to help reduce manufacturing costs, and which in particular, maintains the width of a self-welding layer consisting of a clip structure so as to help improve the quality of adhesion.

Description of the Related Art

In general, a semiconductor package includes a semiconductor chip, a lead frame, and a package body. The semiconductor chip is attached onto a pad of the lead frame, and is electrically connected with a lead of the lead frame by bonding metal wires.

However, the speed of a stack package is low because the stack package using conventional metallic wires exchange electric signals through the metallic wires, and there is degradation in electric properties of each chip because the stack package uses a large number of wires. Further, the size of a package increases because there needs to be an extra space in a substrate to form metallic wires, and the entire height of package is unnecessarily high because a gap is needed for a wire bond on a bonding pad of each chip.

Accordingly, Korean Patent No. 1208332, Korean Patent No. 1669902, Korean Patent No. 1631232, and Korean Utility Model No. 0482370 devised by this applicant of the present invention provide a package structure which is more efficient than a semiconductor package using conventional metallic wires by using a metallic clip structure, thereby performing an excellent function of an electric connection, easily performing thermal radiation, and improving thermal stability.

To connect such a clip structure with a lead or a semiconductor chip of a lead frame, soldering in which solder is used is performed, or a conductive adhesive is injected. In this case, a small amount of solder or a conductive adhesive is injected for adhesion. Accordingly, it is difficult to exactly control the amount of solder during the manufacturing process. Additionally, this directly affects the quality of a semiconductor package.

SUMMARY OF THE INVENTION

Technical Problems

As a means to solve the above-described problems, the present invention provides a clip structure and a semiconductor package using the same which is configured to be a single clip structure consisting of layers of two or more sorts of different metals with different physical properties so as to be selectively self-welded thereby improving the quality of adhesion, or which consists of a lightweight material so as to lighten the weight of semiconductor packages.

Technical Solutions

According to a clip structure of the present invention, which electrically connects package elements in a semiconductor package, the clip structure includes a main metallic layer that is configured to maintain a shape, and a first functional layer that is piled on one surface of the main metallic layer and consists of a metal different from that of the main metal layer.

The main metallic layer may consist of any one selected from a group consisting of copper (Cu), aluminum (Al), magnesium (Mg), nickel (Ni), palladium (Pd), gold (Au), and silver (Ag), or may consist of a metal ally.

The first functional layer may be a self-welding layer having a melting point lower than that of the main metallic layer.

The self-welding layer may consist of a tin (Sn) or a tin alloy

The first functional layer may be a conductive layer having electrical conductivity higher than that of the main metallic layer.

The conductive layer may consist of copper or a copper alloy.

The clip structure according to the present invention is piled on the other surface of the main metallic layer and may further include a second functional layer that consists of a metal or a non-metal different from that the main metallic layer.

The second functional layer may consist of a material selected from a group consisting of silver (Ag), aluminum, silicon (Si), nickel (Ni), alumina ($Al_2O_3$), aluminum nitride (AlN), silica ($SiO_2$), and a mixture where two or more of silver (Ag), aluminum, silicon (Si), nickel (Ni), alumina ($Al_2O_3$), aluminum nitride (AlN), silica ($SiO_2$) are mixed.

A semiconductor package according to the present invention includes a lead frame that consists of a pad and a plurality of lead terminals, a semiconductor chip mounted onto the pad, a clip structure that electrically connects the semiconductor chip and the lead terminals, and a package body protecting the perimeter of the semiconductor chip by means of molding, wherein the clip structure includes a main metallic layer that is configured to maintain a shape, and a first functional layer that is piled on one surface of the main metallic layer and consists of a metal different from that of the main metal layer.

Advantageous Effects

According to the present invention, a clip structure which is configured to be a multiple layer structure including a main metallic layer, and a first functional layer consisting of a metal different from that of the main metallic layer, wherein the first functional layer is configured to be a self-welding one that can be self-welded so as to easily adhere to a semiconductor chip etc. through the self-welding of the self-welding layer during the process of connecting a clip structure and other elements in a semiconductor package instead of soldering in which solder is used or injecting a conductive adhesive for adhesion, thereby making it possible to improve the productivity of semiconductor packages.

Further, the present invention has the advantage of finely controlling the amount of an injected adhesive, and evenly applying a certain bond strength to the entire adhering part, thereby making it possible to improve the credibility of semiconductor package products because the first functional layer that has a certain width and functions as a self-welding layer may be formed in advance.

Further, according to the present invention, a clip structure which is configured to be a multiple layer structure including a main metallic layer, and a first functional layer consisting of a metal different from that of the main metallic layer, wherein the first functional layer is configured to be a conductive layer such that the main metallic layer may consist of a metal that is lighter than that of the conductive layer and has thermal conductivity higher than that of the conductive layer, thereby making it possible to lighten a semiconductor package, and wherein the first functional layer consists of copper, thereby allowing soldering regardless of the material of the main metallic layer.

Further, according to the present invention, a clip structure includes a main metallic layer, and a second functional layer consisting of a metal or a non-metal different from that of the main metallic layer so as to increase thermal radiation and insulation of the clip structure, or to easily adhere to other wires or clips.

Further, the present invention is configured to be a clip structure having a self-welding layer, thereby simplifying the process of adhering and improving efficiency in packing.

DETAILED DESCRIPTION OF THE EMBODIMENTS

Below, preferred embodiments of the present invention will be described in detail with reference to the attached drawings. Additionally, in describing the present invention, detailed descriptions of relevant functions or configurations that are well-known will be omitted if they are deemed to make the gist of the present invention unnecessarily vague.

The present invention relates to a clip structure and a semiconductor package using the same which consists of different metals in multiple layers so as to selectively and easily fix semiconductor chips, or which consists of a lightweight material so as to lighten the weight of semiconductor packages and to help reduce manufacturing costs.

Figure 1:
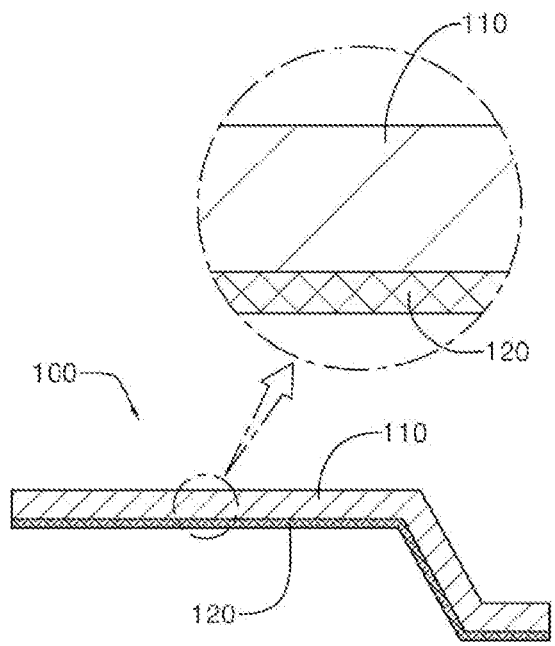
FIG. 1 is a view illustrating a typical configuration of a clip structure according to a specific example of the present invention.

According to a clip structure 100 of the present invention, which electrically connects package elements in a semiconductor package, the clip structure 100, as illustrated in FIG. 1, includes a main metallic layer 110 that is configured to maintain a shape, and a first functional layer 120 that is piled on one surface of the main metallic layer 110 and consists of a metal different from that of the main metal layer 110.

The main metallic layer 110 may be a plate-shaped body that is flat or bent at a certain angle, and may usually consist of two surfaces—i.e. an upper surface and a lower surface. Preferably, the main metallic layer 110 may consist of a metal having excellent mechanical properties so as to maintain a shape. Herein, the first functional layer piled on one surface of the main metallic layer 110 is piled on a surface which contacts a semiconductor chip, usually on the rear surface of the main metallic layer 110. In this case, the other surface may be the surface of the main metallic layer 110.

According to a specific example, the clip structure further includes a first functional layer 120 besides the main metallic layer 110.

The main metallic layer 110 may consists of any one selected from a group consisting of copper, a copper alloy, aluminum, magnesium, nickel, palladium, gold, and silver, or a metal ally. Preferably, the main metallic layer 110 may consist of copper, a copper alloy, aluminum, or an aluminum alloy. The main metallic layer 110 is a basic layer constituting the clip structure, has excellent mechanical properties so as to maintain the shape of a clip and fixes semiconductor chips attached thereto. If the main metallic layer 110 consists of copper, the main metallic layer 110 may perform an electrical connection that is a major function of a clip structure. If the main metallic layer 110 consists of a copper alloy, a copper alloy containing 70 or more weight % of copper may be used for the main metallic layer, and if the main metallic layer 110 consists of an aluminum alloy, an aluminum alloy containing 50 or more weight % of aluminum may be used for the main metallic layer.

The first functional layer 120 is piled on one surface of the main metallic layer 110 and may consist of a metal different from that of the main metal layer 110.

The first functional layer 120 may be a self-welding layer having a melting point lower than that of the main metallic layer 110. The self-welding layer may consist of a tin (Sn) or a tin alloy. If the first functional layer 120, a self-welding layer, consists of tin or a tin alloy, the main metallic layer 110 may preferably consist of copper or a copper alloy. Preferably, the tin alloy consists of tin as a main ingredient and a metal mixture where tin is mixed with other metals. In this case, the metal that is mixed with tin may be selected from a group consisting of copper, lead (Pb), silver, nickel and a mixture where two or more of copper, lead (Pb), silver, nickel are mixed. If tin is mixed with other metals, the adhesion stability of the self-welding layer is improved and the melting point is changed such that the temperature for the process of manufacturing a semiconductor package is properly controlled. Herein, if the first functional layer 120 consists of a tin alloy, a tin alloy containing 80 or more weight % of tin may be used for the first functional layer tin such that the first functional layer 120 as a self-welding layer performs its own function smoothly. Additionally, a lead alloy containing 80 or more weight % of lead may be used for a self-welding layer.

As another specific example, the first functional layer 120 may be a conductive layer having electrical conductivity higher than that of the main metallic layer 110, and the conductive layer may consist of copper or a copper alloy. If the first functional layer 120, a conductive layer, consists of cooper or a copper alloy, the main metallic layer 110, may preferably consist of aluminum, an aluminum alloy, magnesium, or a magnesium alloy. Accordingly, the main metallic layer 110 consists of a metal that is light and has high thermal conductivity such that a semiconductor package using such a clip structure may be lightened. Further, if the first functional layer 120 consists of copper or a copper alloy, a semiconductor chip may be fixed by means of soldering in which solder is used. Further, a semiconductor chip may be fixed by means of an adhering process where a conductive paste is used. Accordingly, packaging is possible without causing a big difference in a conventional packaging process.

The first functional layer 120 is configured to be 10 to 100 μm thick, and the main metallic layer 110 may be configured to be 100 to 500 μm thick, which is thicker than the first functional layer. Additionally, the clip structure 100 may be manufacture by integrating the first functional layer 120 and the main metallic layer 110, which are separately manufactured, by means of compression or by plating the main metallic layer 110 with the first functional layer 120. However, besides the above-described methods, other methods may be applied to integrating the first functional layer 120 and the main metallic layer 110. The present invention is not intended to limit the method for integrating the first functional layer 120 and the main metallic layer 110. As described above, in the process of manufacturing a clip structure, the first functional layer 120 is formed in advance as a self-welding layer with a consistent thickness so as to be integrated into the main metallic layer of a clip structure before a package adhesion process, and in the package adhesion process, the first functional layer 120 is self-welded and adheres. Accordingly, unlike a conventional adhesion process in which the amount of solder or a conductive adhesive has to be precisely controlled and injected for adhesion, the amount of solder or a conductive adhesive may be evenly controlled and injected for adhesion. As a result, the adhesion process may be easily and exactly performed thereby improving the quality of adhesion.

Figure 2:
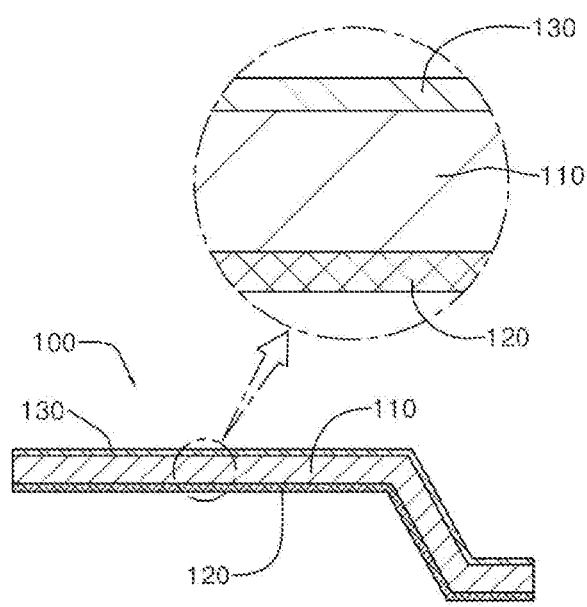
FIG. 2 is a view illustrating a typical configuration of a clip structure according to another specific example of the present invention.

Additionally, as illustrated in FIG. 2, the present invention may further include a second functional layer 130 that is piled on the other surface of the main metallic layer 110 and consists of a metal or non-metal different from that of the main metallic layer 110, besides the first functional layer 120. Preferably, the second functional layer 130 may consist of any one selected from a group consisting of silver, aluminum, silicon, nickel, alumina, aluminum nitride, silica and a mixture where two or more of silver, aluminum, silicon, nickel, alumina, aluminum nitride, silica are mixed.

The second functional layer 130 is selectively configured depending on the properties of the above-listed materials, and the functions of the second functional layer 130 depending on each of the materials may fall into three categories.

First, if another metal wire or clip is used for other electrical connections on the upper portion of the clip structure 100, adhesion (e.g. grounding and bonding) may be easily performed. This makes it possible to avoid inconvenience caused by silver (Ag) plating that has to be done to an adhering part during grounding and boding performed on the upper portion of a conventional clip structure.

Second, the clip structure 100 consists of a material with a high thermal conductivity so as to increase thermal radiation thereby making it easy to discharge heat in a package.

Third, the clip structure 100 consists of an insulated material so as to prevent an electrical short (short-circuit) between the clip structure and other elements on the upper portion of the clip structure thereby creating an environment where other kinds of semiconductor chips may be piled.

According to another embodiment of the present invention, the major ingredient of the main metallic layer 110 is not limited to copper. Because copper is relatively expensive, in the case of the main metallic layer 110 that includes aluminum as a major ingredient instead of copper, the first functional layer 120, as in the above-described embodiment, may include tin (Sn) or copper as a major ingredient. In this case, the process of soldering can be separately needed to connect the clip structure 100 and other elements but has the advantage of reducing manufacturing costs.

If the major ingredient of the first functional layer 120 is copper (Cu), the composition ratio of copper is preferably 60 or more weight % with respect to the entire weight of the first functional layer 120, and to reduce costs, the proportion ratio of aluminum is preferably at least 80 weight %.

Figure 3:
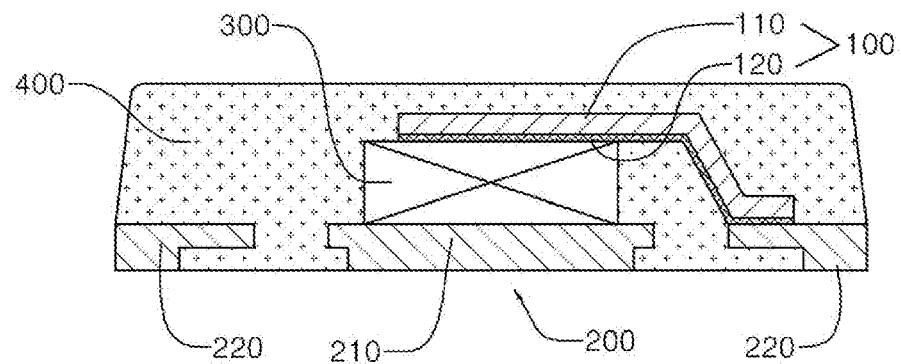
FIG. 3 is a view illustrating a typical configuration of a semiconductor package using a clip structure according to another specific example of the present invention.

FIG. 3 illustrates one embodiment of a semiconductor package using a clip structure of the present invention. The semiconductor package includes a lead frame 200 that consists of a pad 210 and a plurality of lead terminals 220, a semiconductor chip 300 mounted onto the pad 210, a clip structure 100 that electrically connects the semiconductor chip 300 and the lead terminal 230, and a package body 400 protecting the perimeter of the semiconductor chip 300 by means of molding, wherein the clip structure 100 includes a main metallic layer 110 that is configured to maintain a shape, and a first functional layer 120 that is piled on one surface of the main metallic layer 110 and consists of a metal different from that of the main metallic layer 110.

The main metallic layer 110 and the first functional layer 120 of the clip structure 100 are similar or identical to what has been described. If the first functional layer 120 functions as a self-welding layer, the first functional layer may be a self-welding layer having a melting point lower than that of the main metallic layer 110, and the self-welding layer may consist of a tin or a tin alloy. If the first functional layer 120, a self-welding layer, consists of a tin or a tin alloy, the main metallic layer 110 may preferably consist of copper or a copper alloy. Accordingly, adhesion may be performed during the package adhesion process by the self-welded first functional layer 120.

According to a semiconductor package of the present invention, the first functional layer 120 of the clip structure 100 is configured to be melted and adhere on its own. Accordingly, a semiconductor package may be produced without solder or a conductive adhesive. However, adhesion may be more firmly performed when solder or a conductive adhesive 500 is used for adhesion together with the self-welding layer, as illustrated in FIG. 4.

Figure 4:
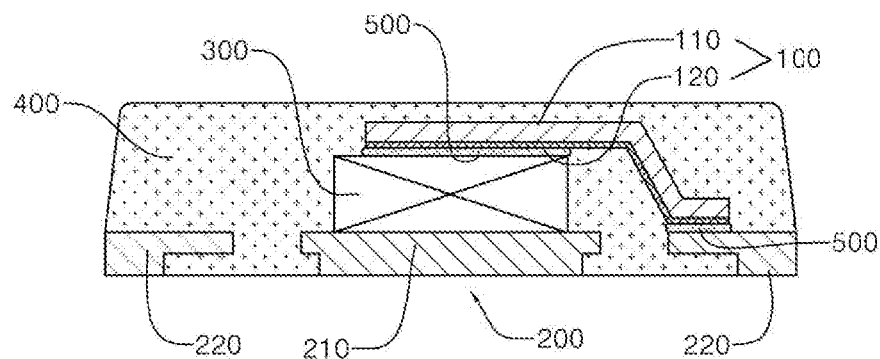
FIG. 4 is a view illustrating the second embodiment of a semiconductor package using a clip structure of the present invention.

For instance, if the major ingredient of the main metallic layer 110 is aluminum, and the major ingredient of the first functional layer 120 is copper, the process of soldering by means of a conductive adhesive 500 is needed, as illustrated in FIG. 4.

Figure 5:
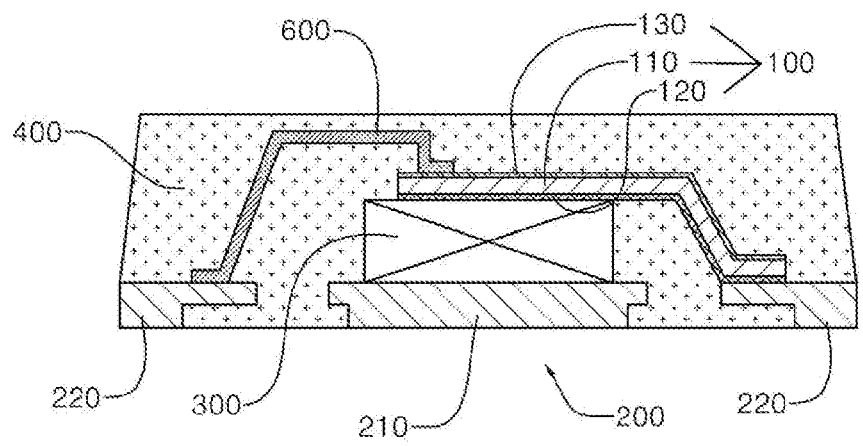
FIG. 5 is a view illustrating a typical configuration of a semiconductor package using a clip structure according to yet another specific example of the present invention.

Additionally, as described in FIG. 5, the present invention may further include a second functional layer 130 that is piled on the other surface of the main metallic layer 110 and consists of a metal or a non-metal different from that of the main metallic layer 110. Preferably, the second functional layer 130 may consist of any one selected form a group consisting of silver, aluminum, silicon, nickel, alumina, aluminum nitride, silica and a mixture where two or more of silver, aluminum, silicon, nickel, alumina, aluminum nitride, silica are mixed. The second functional layer 130 may perform thermal radiation or insulation depending on materials of the second functional layer 130, but if a wire or clip 600 is further included so as to electrically connect the upper portion of the clip structure 100 and other lead terminals 220, as illustrated in FIG. 5, adhesion (e.g. grounding and bonding) may be easily performed.

The present invention has been described with reference to the above-described embodiments. However, it should be understood that various modifications may be made within the scope of the technical spirit of the present invention.

| Description of the Symbols | |
|---|---|
| 100: Clip structure | 110: Main metallic layer |
| 120: First functional layer | 130: Second functional layer |
| 200: Lead frame | 210: Pad |
| 220: Lead terminal | 300: Semiconductor chip |
| 400: Package body | 500: Conductive adhesive |
| 600: Wire or clip | |

The invention claimed is:

1. A clip structure electrically connecting package elements in a semiconductor package, comprising:
 a main metallic layer configured to maintain a shape; and
 a first functional layer piled on one surface of the main metallic layer and consisting of a metal different from that of the main metallic layer,
 wherein the first functional layer is configured to be a conductive layer having electrical conductivity higher than that of the main metallic layer.

2. The clip structure according to claim 1, wherein the main metallic layer consists of any one selected from a group consisting of copper, aluminum, magnesium, nickel, palladium, gold and silver, or a metal ally.

3. The clip structure according to claim 1, wherein the first functional layer is configured to be a self-welding layer having a melting point lower than that of the main metallic layer.

4. The clip structure according to claim 3, wherein the self-welding layer consists of tin or a tin alloy.

5. The clip structure according to claim 1, wherein the conductive layer consists of copper or a copper ally.

6. The clip structure according to claim 1, wherein the clip structure further comprises a second functional layer piled on the other surface of the main metallic layer and consisting of a metal or a non-metal different form that of the main metallic layer.

7. The clip structure according to claim 6, wherein the second functional layer consists of any one selected form a group consisting of silver, aluminum, silicon, nickel, alumina, aluminum nitride, silica and a mixture where two or more of silver, aluminum, silicon, nickel, alumina, aluminum nitride, silica are mixed.

8. A semiconductor package comprising:
 a lead frame comprising a pad and a plurality of lead terminals;
 a semiconductor chip mounted onto the pad;
 a clip structure electrically connecting the semiconductor chip and the lead terminal; and
 a package body protecting the perimeter of the semiconductor chip by means of molding,
 wherein the clip structure comprises a main metallic layer configured to maintain a shape, and a first functional layer piled on one surface of the main metallic layer and consisting of a metal different from that of the main metallic layer,
 wherein the first functional layer is configured to be a conductive layer having electrical conductivity higher than that of the main metallic layer.

9. The semiconductor package according to claim 8, wherein the main metallic layer consists of any one selected from a group consisting of copper, aluminum, magnesium, nickel, palladium, gold and silver, or a metal ally.

10. The semiconductor package according to claim 8, wherein the first functional layer is configured to be a self-welding layer having a melting point lower than that of the main metallic layer.

11. The semiconductor package according to claim 10, wherein the self-welding layer consists of tin or a tin alloy.

12. The semiconductor package according to claim 8, wherein the conductive layer consists of copper or a copper ally.

13. The semiconductor package according to claim 8, wherein the semiconductor package further comprises a second functional layer piled on the other surface of the main metallic layer and consisting of a metal or a non-metal different form that of the main metallic layer.

14. The semiconductor package according to claim 13, wherein
 the second functional layer consists of any one selected form a group consisting of silver, aluminum, silicon, nickel, alumina, aluminum nitride (AlN), silica and a mixture where two or more of silver, aluminum, silicon, nickel, alumina, aluminum nitride, silica are mixed.

* * * * *